(12) United States Patent
Kikuchi et al.

(10) Patent No.: US 12,237,646 B2
(45) Date of Patent: Feb. 25, 2025

(54) SEMICONDUCTOR OPTICAL DEVICE AND METHOD OF MANUFACTURING SAME

(71) Applicant: Sumitomo Electric Industries, Ltd., Osaka (JP)

(72) Inventors: Takehiko Kikuchi, Osaka (JP); Naoki Fujiwara, Osaka (JP); Nobuhiko Nishiyama, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 519 days.

(21) Appl. No.: 17/666,896

(22) Filed: Feb. 8, 2022

(65) Prior Publication Data
US 2022/0278503 A1 Sep. 1, 2022

(30) Foreign Application Priority Data
Mar. 1, 2021 (JP) ................................ 2021-032021

(51) Int. Cl.
*H01S 5/10* (2021.01)
*H01S 5/02* (2006.01)
*H01S 5/22* (2006.01)
*H01S 5/30* (2006.01)

(52) U.S. Cl.
CPC ............ *H01S 5/1003* (2013.01); *H01S 5/021* (2013.01); *H01S 5/22* (2013.01); *H01S 5/3013* (2013.01)

(58) Field of Classification Search
CPC ............................. H01S 5/1003; H01S 5/3013
See application file for complete search history.

(56) References Cited

U.S. PATENT DOCUMENTS

| | | | |
|---|---|---|---|
| 2014/0241734 A1* | 8/2014 | Sagawa | G02B 6/131 398/139 |
| 2017/0098922 A1* | 4/2017 | Hatori | H04B 10/501 |
| 2020/0098567 A1* | 3/2020 | Kikuchi | H01L 31/02327 |

FOREIGN PATENT DOCUMENTS

JP 2020-053527 A 4/2020

* cited by examiner

*Primary Examiner* — Tuan N Nguyen
(74) *Attorney, Agent, or Firm* — Volpe Koenig

(57) ABSTRACT

A method of manufacturing a semiconductor optical device includes a step of bonding a semiconductor element to a substrate that includes silicon, the semiconductor element being made of a III-V compound semiconductor and having optical gain; after the step of bonding the semiconductor element, a step of molding the semiconductor element by wet-etching; and after the step of molding the semiconductor element, a step of forming a mesa at the semiconductor element. The substrate includes a waveguide, a groove that extends along the waveguide, a terrace that is positioned on a side of the groove opposite to the waveguide, and a wall that covers the groove. The step of bonding the semiconductor element is a step of bonding the semiconductor element to the waveguide, the groove, the terrace, and the wall of the substrate.

11 Claims, 10 Drawing Sheets

SEMICONDUCTOR OPTICAL DEVICE AND METHOD OF MANUFACTURING SAME

CROSS REFERENCES TO RELATED APPLICATIONS

The present disclosure contains subject matter related to Japanese Patent Application No. 2021-032021 filed in the Japan Patent Office on Mar. 1, 2021, the entire contents of which are incorporated herein by reference.

BACKGROUND OF THE INVENTION

1. Field of the Invention

The present disclosure relates to a semiconductor optical device and a method of manufacturing the same.

2. Description of the Related Art

Japanese Unexamined Patent Application Publication No. 2020-53527 discloses a technology of bonding a semiconductor element made of a III-V compound semiconductor to a substrate such as a silicon-on-insulator (SOI) substrate including a waveguide (so-called silicon photonics). The substrate includes, for example, a waveguide made of, for example, silicon (Si). A III-V compound semiconductor is a direct-transition semiconductor and has high optical gain. The semiconductor element is evanescently optically coupled to the substrate, and exiting light of the semiconductor element propagates through the waveguide of the substrate.

SUMMARY OF THE INVENTION

Due to, for example, positional displacement occurring when bonding the semiconductor element to the substrate, the position of the semiconductor element in a plane of the substrate may vary. After bonding the semiconductor element to the substrate, by molding the semiconductor element by, for example, wet-etching, it is possible to eliminate the variations in the position occurring at the time of the bonding. After the molding, by forming, for example, a mesa that becomes a light-emitting region, it is possible to suppress the positional displacement.

However, an etchant may enter a groove (trench) of the substrate, and, for example, the mesa of the semiconductor element may be etched from a bonding interface. The semiconductor element may be damaged by such unintended etching, and the bonding strength may be reduced. Accordingly, it is an object of the present disclosure to provide a semiconductor optical device and a method of manufacturing the same, which are capable of suppressing damage caused by etching.

A method of manufacturing a semiconductor optical device according to the present disclosure includes a step of bonding a semiconductor element to a substrate that includes silicon, the semiconductor element being made of a III-V compound semiconductor and having optical gain; after the step of bonding the semiconductor element, a step of molding the semiconductor element by wet-etching; and after the step of molding the semiconductor element, a step of forming a mesa at the semiconductor element. The substrate includes a waveguide, a groove that extends along the waveguide, a terrace that is positioned on a side of the groove opposite to the waveguide, and a wall that covers the groove. The step of bonding the semiconductor element is a step of bonding the semiconductor element to the waveguide, the groove, the terrace, and the wall of the substrate.

A semiconductor optical device according to the present disclosure includes a substrate and a semiconductor element. The substrate includes silicon, and includes a waveguide, a groove that extends along the waveguide, and a terrace that opposes the waveguide with the groove therebetween. The semiconductor element is bonded to the waveguide and the terrace, is made of a III-V compound semiconductor, and has optical gain. The waveguide includes a first portion and a second portion. The first portion and the second portion are disposed side by side in an extension direction of the waveguide and are connected to each other. The second portion has a width that is larger than a width of the first portion in a direction intersecting the extension direction of the waveguide. The substrate includes a wall that is connected to the second portion and the terrace and that covers the groove, or the second portion covers the groove.

DESCRIPTION OF THE PREFERRED EMBODIMENTS

Figure 1A:
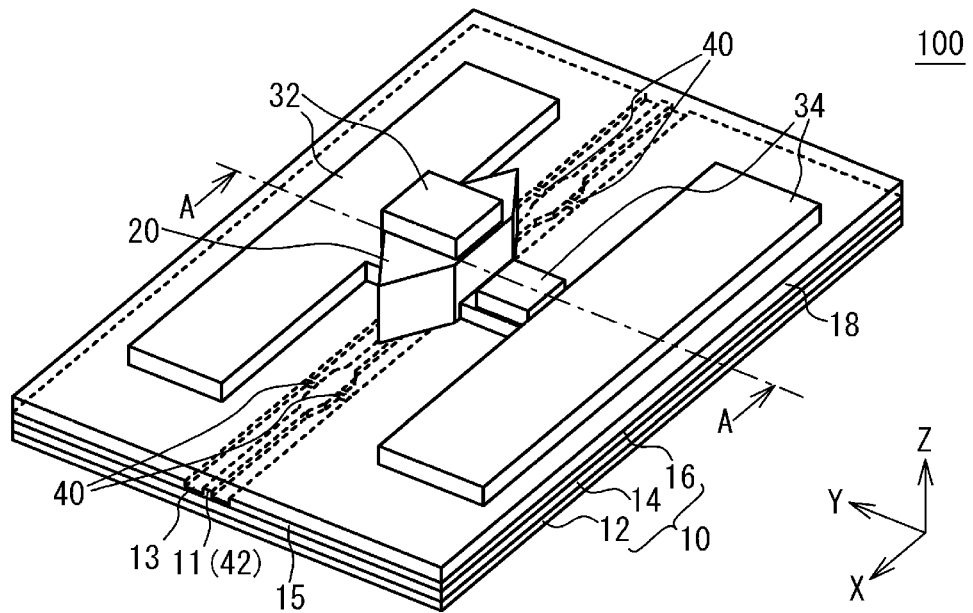
FIG. 1A is a perspective view illustrating a semiconductor optical device according to a first embodiment.

Description of Embodiments of the Present Disclosure

First, the contents of embodiments of the present disclosure are listed and described.

In one aspect of the present disclosure, (1) a method of manufacturing a semiconductor optical device includes a step of bonding a semiconductor element to a substrate that includes silicon, the semiconductor element being made of a III-V compound semiconductor and having optical gain; after the step of bonding the semiconductor element, a step of molding the semiconductor element by wet-etching; and after the step of molding the semiconductor element, a step of forming a mesa at the semiconductor element. The substrate includes a waveguide, a groove that extends along the waveguide, a terrace that is positioned on a side of the groove opposite to the waveguide, and a wall that covers the groove. The step of bonding the semiconductor element is a step of bonding the semiconductor element to the waveguide, the groove, the terrace, and the wall of the substrate. Due to the wall holding back an etchant of the wet-etching, the etchant is suppressed from entering the interior by the wall. It is possible to suppress unintended etching of the semiconductor element.

(2) In the step of molding the semiconductor element, the semiconductor element may be molded so that an end portion of the semiconductor element is positioned on the wall. Due to the wall suppressing entry of an etchant, it is possible to suppress unintended etching of the semiconductor element. Since the semiconductor element does not extend beyond and protrude from the wall, the etchant is unlikely to remain below the semiconductor element. Loss of light caused by the etchant is suppressed.

(3) The waveguide may include a first portion and a second portion, the first portion and the second portion may be disposed side by side in an extension direction of the waveguide and may be connected to each other, the second portion may have a width that is larger than a width of the first portion in a direction intersecting the extension direction of the waveguide, and the wall may be connected to the second portion and the terrace. It is possible to suppress the effects of the wall on the propagation of light and to suppress loss of the light.

(4) The wall may be connected to a central portion of the second portion in the extension direction of the waveguide. It is possible to suppress the effects of the wall on the propagation of light and to suppress loss of the light.

(5) A length of the second portion in the extension direction of the waveguide may be 50 μm or greater. It is possible to suppress the effects of the wall on the propagation of light and to suppress loss of the light.

(6) A thickness of the wall may be 5 μm or greater. An end portion of the semiconductor element after the wet-etching can be formed on the wall.

(7) The waveguide may include a first portion and a second portion, the first portion and the second portion may be disposed side by side in an extension direction of the waveguide and may be connected to each other, the second portion may have a width that is larger than a width of the first portion in a direction intersecting the extension direction of the waveguide, and the second portion may be connected to the terrace and may function as the wall. Due to the wall holding back an etchant of the wet-etching, it is possible to suppress unintended etching of the semiconductor element.

(8) The semiconductor element may include a compound semiconductor baseplate and a compound semiconductor layer that is stacked on the compound semiconductor baseplate; in the step of bonding the semiconductor element, the compound semiconductor layer and the substrate may be bonded to each other; the method may include, after the step of bonding the semiconductor element, a step of removing the compound semiconductor baseplate of the semiconductor element by wet-etching; and, after the step of removing the compound semiconductor baseplate, the step of molding the semiconductor element may be performed. It is possible to eliminate by the wet-etching damage to the semiconductor element occurring when the compound semiconductor baseplate is being etched.

(9) The substrate may be a SOI substrate, the substrate may include a silicon layer, and the waveguide, the terrace, and the wall may be formed at the silicon layer. The height of the waveguide, the height of the terrace, and the height of the wall can be about the same, and entry of an etchant can be effectively suppressed. Since light is confined in the silicon layer, it is possible to suppress loss.

(10) The method may include, after the step of wet-etching, a step of covering the substrate with an electrically insulating film, and the step of forming the mesa at the semiconductor element may include, after the step of covering the substrate with the electrically insulating film, a step of dry-etching the semiconductor element. By covering the substrate with the electrically insulating film, it is possible to suppress damage to the substrate caused by the dry etching.

(11) In another aspect of the present disclosure, a semiconductor optical device includes a substrate and a semiconductor element. The substrate includes silicon, and includes a waveguide, a groove that extends along the waveguide, and a terrace that opposes the waveguide with the groove therebetween. The semiconductor element is bonded to the waveguide and the terrace, is made of a III-V compound semiconductor, and has optical gain. The waveguide includes a first portion and a second portion. The first portion and the second portion are disposed side by side in an extension direction of the waveguide and are connected to each other. The second portion has a width that is larger than a width of the first portion in a direction intersecting the extension direction of the waveguide. The substrate includes a wall that is connected to the second portion and the terrace and that covers the groove, or the second portion covers the groove. Due to the wall holding back an etchant, it is possible to suppress unnecessary etching.

Details of Embodiments of the Present Disclosure

Specific examples of a semiconductor optical device and a method of manufacturing the same according to embodiments of the present disclosure are described below with reference to the drawings. Note that the present disclosure is not limited to these exemplifications, is defined by the scope of the claims, and is intended to include all changes within meanings equivalent to the scope of the claims and the scope of the claims.

First Embodiment

Semiconductor Optical Device

Figure 1B:
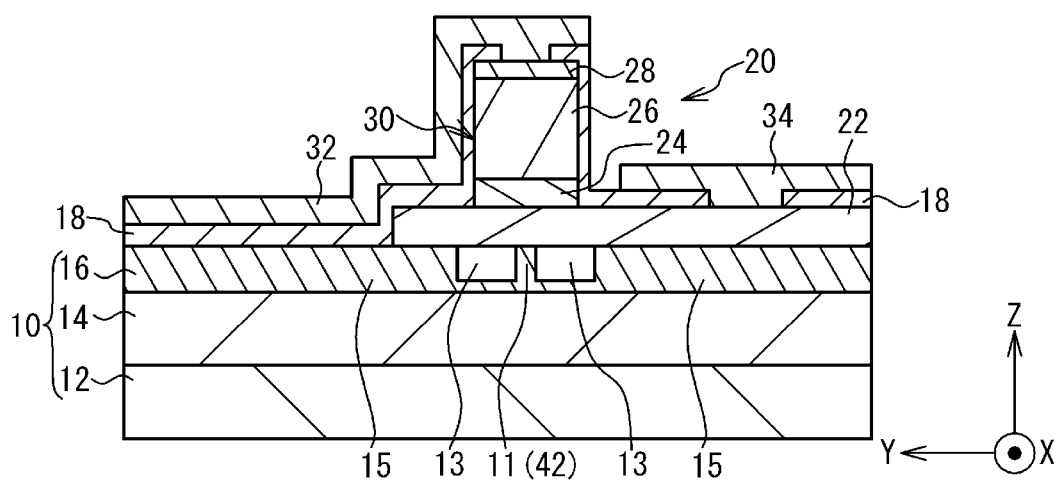
FIG. 1B is a sectional view along line A-A of FIG. 1A.

FIG. 1A is a perspective view illustrating a semiconductor optical device 100 according to a first embodiment. FIG. 1B is a sectional view along line A-A of FIG. 1A. As illustrated in FIG. 1A and FIG. 1B, the semiconductor optical device 100 is a hybrid laser device including a substrate 10 and a semiconductor element 20. An upper surface of the substrate 10 extends in an XY plane, and the semiconductor element 20 is bonded to the upper surface. A Z-axis direction is a direction normal to the upper surface of the substrate 10. An X-axis direction, a Y-axis direction, and the Z-axis direction are orthogonal to each other.

Substrate

Figure 2A:
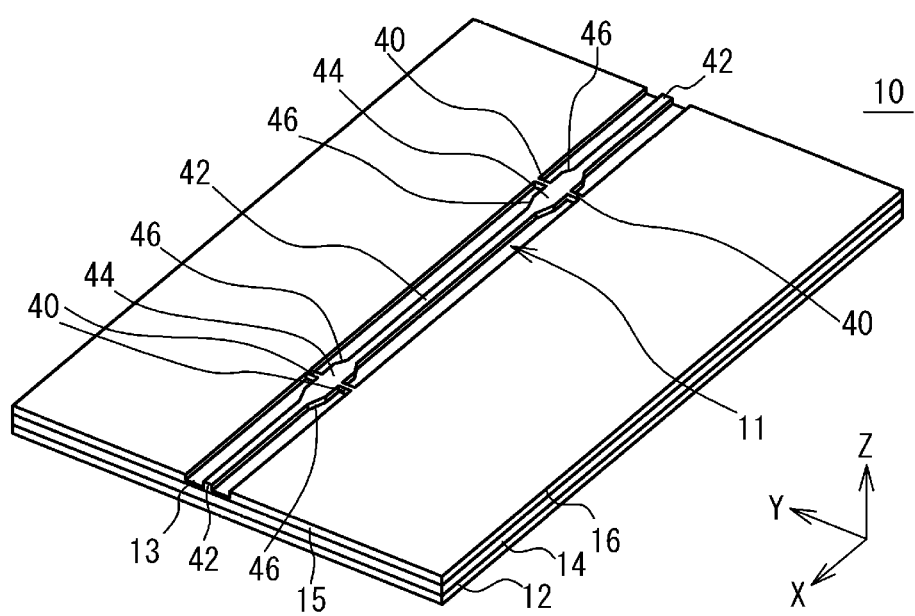
FIG. 2A is a perspective view illustrating a substrate.
Figure 2B:
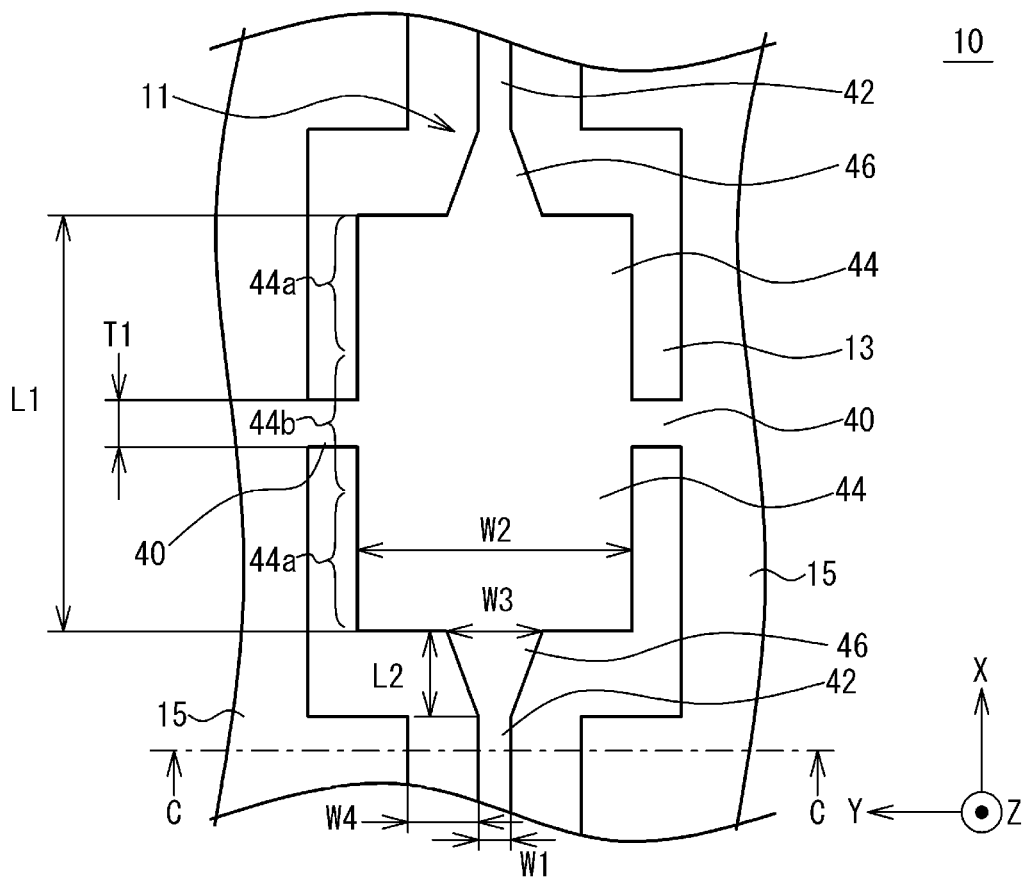
FIG. 2B is a plan view illustrating the substrate.
Figure 2C:
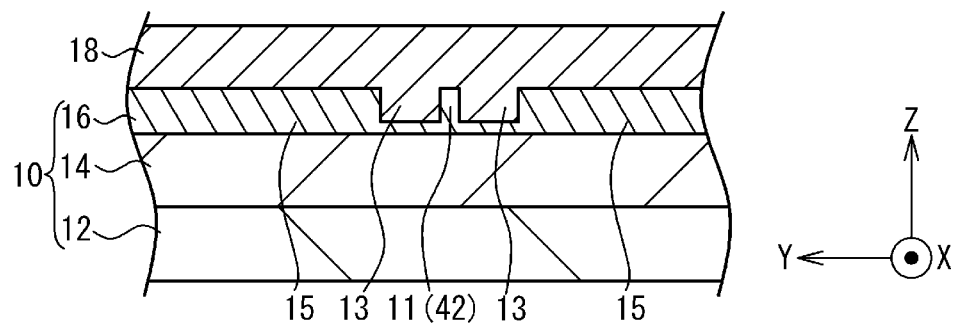
FIG. 2C is a sectional view along line B-B of FIG. 2B.

FIG. 2A is a perspective view illustrating the substrate 10. FIG. 2B is a plan view illustrating the substrate 10, and is an enlarged view of the vicinity of walls 40. FIG. 2C is a sectional view along line B-B of FIG. 2B.

The substrate 10 is a SOI substrate including a baseplate 12, a silicon oxide ($SiO_2$) layer 14, and a silicon (Si) layer 16, which are stacked on each other in order in the Z-axis direction. The baseplate 12 is made of Si. The thickness of the $SiO_2$ layer 14 is, for example, 3 μm. The thickness of the Si layer 16 is, for example, 220 nm. The upper surface of the substrate 10 is covered with an electrically insulating film 18. The electrically insulating film 18 is made of, for example, SiO$_2$ having a thickness of 1 μm. The refractive index of the Si layer 16 is 3.45. The refractive indices of the SiO$_2$ layer 14 and the electrically insulating film 18 are lower than the refractive index of the Si layer 16, and are 1.45.

As illustrated in FIG. 2A, the Si layer 16 of the substrate 10 includes a waveguide 11, two grooves 13, two terraces 15, and four walls 40. The waveguide 11 and the grooves 13 extend in the X-axis direction. The two grooves 13 are each positioned on a corresponding one of two sides of the waveguide 11 in the Y-axis direction. Each terrace 15 is a plane of the Si layer 16, and is positioned on a side of the corresponding groove 13 opposite to the waveguide 11. Although, in FIG. 1A to FIG. 2C, a bottom surface defining each groove 13 is the Si layer 16, the bottom surface may be the SiO$_2$ layer 14. The walls 40 are separated from the semiconductor element 20. Of the four walls 40, two are positioned on one end side of the semiconductor element 20 in the X-axis direction, and the other two are positioned on the other end side of the semiconductor element 20 in the X-axis direction.

As illustrated in FIG. 2A, the waveguide 11 includes three narrow-width portions 42 (first portions) and two wide-width portions 44 (second portions). In the X-axis direction, the narrow-width portion 42, the wide-width portion 44, the narrow-width portion 42, the wide-width portion 44, and the narrow-width portion 42 are disposed side by side in order. Tapered portions 46 are each provided between a corresponding one of the narrow-width portions 42 and a corresponding one of the wide-width portions 44. The narrow-width portions 42 and the wide-width portions 44 are connected to each other via the tapered portions 46. One of the three narrow-width portions 42 extends to one end of the substrate 10 in the X-axis direction. Another one of the three narrow-width portions 42 extends to the other end of the substrate 10 in the X-axis direction. The center narrow-width portion of the three narrow-width portions 42 is positioned between the two wide-width portions 44 in the X-axis direction. The semiconductor element 20 illustrated in FIG. 1A is provided on this narrow-width portion 42.

FIG. 2B illustrates two narrow-width portions 42, one wide-width portion 44, and two tapered portions 46 of the waveguide 11. In the X-axis direction, the narrow-width portion 42, the tapered portion 46, the wide-width portion 44, the tapered portion 46, and the narrow-width portion 42 are disposed side by side in order. In the Y-axis direction, the wide-width portion 44 has a width that is larger than the width of each narrow-width portion 42. Each tapered portion 46 is provided at a corresponding one of two ends of the wide-width portion 44 in the X-axis direction. Each tapered portion 46 tapers away from the wide-width portion 44 in the X-axis direction. Each narrow-width portion 42 is connected to a tip of the corresponding tapered portion 46. Each narrow-width portion 42 extends in the X-axis direction. The narrow-width portions 42, the wide-width portion 44, and the tapered portions 46 are formed at the Si layer 16 of the substrate 10, and the grooves 13 are each provided on a corresponding one of two sides of each narrow-width portion 42, the wide-width portion 44 and each tapered portion 46.

As illustrated in FIG. 2B, of the wide-width portion 44, portions that are close to the tapered portions 46 are regions 44a, and a central portion in the X-axis direction is a region 44b. From the region 44b of the wide-width portion 44, two walls 40 protrude in the Y-axis direction. One end of one wall 40 is connected to the region 44b of the wide-width portion 44, and the other end thereof is connected to the corresponding terrace 15. In other words, the wall 40 extends in the Y-axis direction, crosses the corresponding groove 13, and covers the corresponding groove 13. The wall 40 is connected to a central portion of the region 44b of the wide-width portion 44 in the X-axis direction. Similarly to the waveguide 11, the wall 40 is formed at the Si layer 16 of the substrate 10. An upper surface of the waveguide 11, an upper surface of the terrace 15, and an upper surface of the wall 40 are positioned at the same height in the Z-axis direction. Since the wall 40 covers the groove 13, it is possible to suppress entry of an etchant in wet-etching of a manufacturing step of the semiconductor optical device 100 and to prevent unintended etching of the semiconductor element 20.

A width W1 of each narrow-width portion 42 illustrated in FIG. 2B is, for example, 0.5 μm. A width W2 of the wide-width portion 44 in the Y-axis direction is, for example, 4 μm, and a length L1 thereof in the X-axis direction is, for example, 20 μm or greater and 60 μm or less. A width W3 of each tapered portion 46 at a position of connection to the wide-width portion 44 is, for example, 1.5 μm or greater and 2 μm or less. A length L2 of each tapered portion 46 is, for example, 10 μm to 15 μm. A width W4 of each groove 13 is, for example, 1 μm. A thickness T1 of each wall 40 is, for example, 5 μm.

As illustrated in FIG. 2C, an inner side of each groove 13 is embedded with the electrically insulating film 18. That is, as illustrated in FIG. 1B, at a lower side of the semiconductor element 20, the upper surface of the waveguide 11 and the upper surface of each terrace 15 are in contact with the semiconductor element 20, and each groove 13 is hollow. As illustrated in FIG. 2C, at positions separated from the semiconductor element 20, the electrically insulating film 18 covers the upper surface and side surfaces of the waveguide 11, covers the upper surface of each terrace 15, and is embedded at the inner side of each groove 13.

Semiconductor Element

As illustrated in FIG. 1B, the semiconductor element 20 includes a cladding layer 22, a core layer 24, a cladding layer 26, and a contact layer 28, which are stacked on each other in order from the substrate 10. The cladding layer 22 is made of, for example, n-type indium phosphide (n-InP) having a thickness of 400 nm. The cladding layer 26 is made of, for example, p-type indium phosphide (p-InP) having a thickness of 2 μm. The contact layer 28 is made of, for example, (p+)-gallium indium arsenide (GaInAs). The core layer 24 includes a plurality of well layers and barrier layers that are alternately stacked on each other, and has a multi-quantum well (MQW) structure. The well layers and the barrier layers are made of, for example, non-doped gallium indium arsenide phosphide (i-GaInAsP). The thickness of the core layer 24 is, for example, 300 nm. The core layer 24 has optical gain, and emits light having a wavelength of, for example, 1.55 μm. Each layer of the semiconductor element 20 may be made of III-V compound semiconductors other than those mentioned above.

As illustrated in FIG. 1A, the semiconductor element 20 includes a mesa 30 and electrodes 32 and 34. The mesa 30 of the semiconductor element 20 is positioned above the waveguide 11. A tip of the mesa 30 in the X-axis direction tapers along the waveguide 11. In the X-axis direction, one wide-width portion 44 is positioned at one end portion side of the mesa 30, and one wide-width portion 44 is positioned at the other end portion side of the mesa 30. The mesa 30 is separated from the wide-width portions 44 and the walls 40.

As illustrated in FIG. 1B, the mesa 30 is formed from the core layer 24, the cladding layer 26, and the contact layer 28, and is positioned above the waveguide 11 of the substrate 10. The cladding layer 22 is positioned between the mesa 30 and the substrate 10, and extends toward an outer side of the mesa 30 within the XY plane. The cladding layer 22 is in contact with the upper surface of the waveguide 11 and the upper surface of each terrace 15 of the substrate 10. A surface of the mesa 30 and a surface of the cladding layer 22 are covered with the electrically insulating film 18. The electrically insulating film 18 has opening portions above the mesa 30 and above the cladding layer 22.

As illustrated in FIG. 1B, the electrode 32 extends to an upper surface of the electrically insulating film 18 on the outer side of the mesa 30 from an upper side of the mesa 30, and is electrically connected to the contact layer 28 via the corresponding opening portion of the electrically insulating film 18. The electrode 32 is formed from, for example, a layered body of, for example, titanium, platinum, and gold (Ti/Pt/Au). The electrode 34 is separated from the electrode 32, is provided on the upper surface of the electrically insulating film 18, and is electrically connected to the cladding layer 22 via the corresponding opening portion of the electrically insulating film 18. The electrode 34 is made of, for example, metals, such as an alloy of gold, germanium, and nickel (AuGeNi). The electrodes 32 and 34 may be provided with, for example, an Au plating layer.

By inputting an electrical signal to the electrodes 32 and 34 and injecting carriers into the core layer 24 of the semiconductor element 20, the electrodes 32 and 34 are caused to emit light. The semiconductor element 20 and the substrate 10 are evanescently optically coupled to each other, and light transits to the substrate 10. The light propagates through the waveguide 11 and exits to an outer side from an end portion of the substrate 10.

The narrow-width portions 42 and the wide-width portions 44 of the waveguide 11 function as a multi-mode interface (MMI) for one input and one output. Each narrow-width portion 42 is a single-mode waveguide. Each wide-width portion 44 is a multi-mode waveguide. Single-mode light propagates through the narrow-width portions 42 and is incident upon the wide-width portions 44 via the tapered portions 46. The tapered portions 46 suppress reflection of light to suppress loss of the light between the narrow-width portions 42 and the wide-width portions 44. Light propagates in a multi-mode through the wide-width portions 44, is incident upon the narrow-width portions 42 via the tapered portions 46, and propagates again in the single mode.

Figure 3:
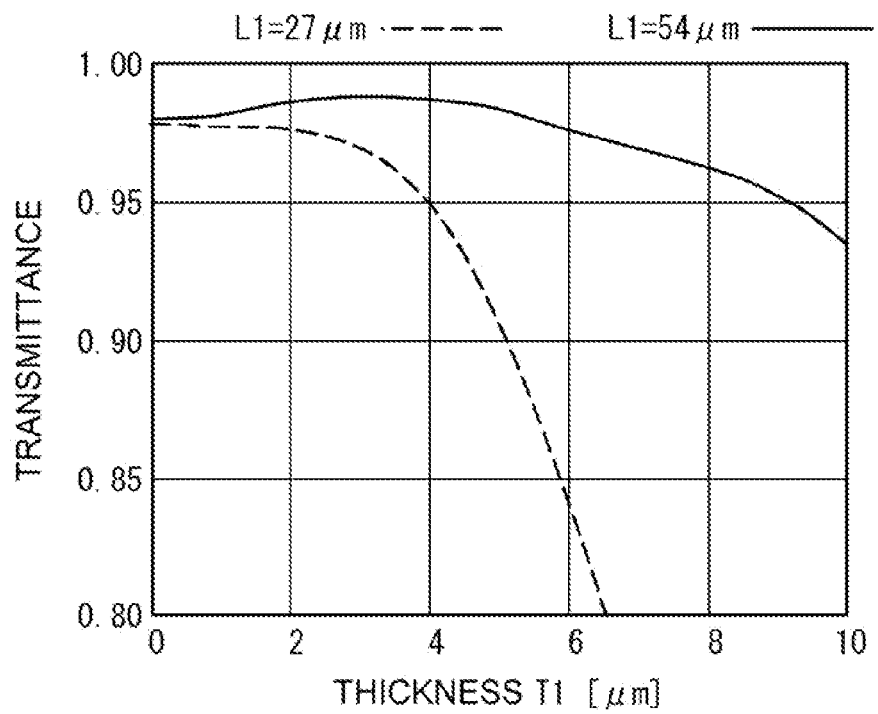
FIG. 3 illustrates transmittance.

FIG. 3 illustrates transmittance. The horizontal axis indicates the thickness of each wall 40, and the vertical axis indicates transmittance. A width of 0 μm at the horizontal axis means that the walls 40 do not exist. An example indicated by a broken line and an example indicated by a solid line in FIG. 3 differ from each other in that the transmittance is calculated by using different dimensions. The broken line corresponds to an example in which the length L1 of each wide-width portion 44 is 27 μm, and the solid line corresponds to an example in which the length L1 of each wide-width portion 44 is 54 μm.

As illustrated in FIG. 3, in the example indicated by the broken line, the transmittance is 0.95 or greater in a range in which the thickness T1 of each wall 40 is 0 μm to 4 μm. When the thickness T1 becomes greater than 4 μm, the transmittance is suddenly reduced. Although light is strongly confined in the narrow-width portions 42, the light tends to spread in a width direction when the light is incident upon the wide-width portions 44. The light is affected by the walls 40 and leaks toward the terraces 15. In the example indicated by the broken line, the length L1 of each wide-width portion 44 is 27 μm, and each wall 40 is relatively thick with respect to the wide-width portions 44. The effects of the walls 40 are increased, and the transmittance is reduced.

In the example indicated by the solid line, up to a range in which the thickness of each wall 40 is 0 μm to 8 μm or greater, the transmittance is maintained at 0.95 or greater. The length L1 of each wide-width portion 44 is 54 μm, which is approximately twice that of the example indicated by the broken line. At the regions 44a illustrated in FIG. 2A of the wide-width portion 44, light spreads and is distributed in the Y-axis direction. On the other hand, at the region 44b, light is focused on a central side in the Y-axis direction. Although the walls 40 are each connected to a corresponding one of two ends of the corresponding region 44b, since the light is concentrated and distributed at the central side of each region 44b, the light is unlikely to be affected by the walls 40. Since the light is unlikely to leak, a high transmittance is obtained as indicated by the solid line of FIG. 3.

Manufacturing Method

Figure 4A:
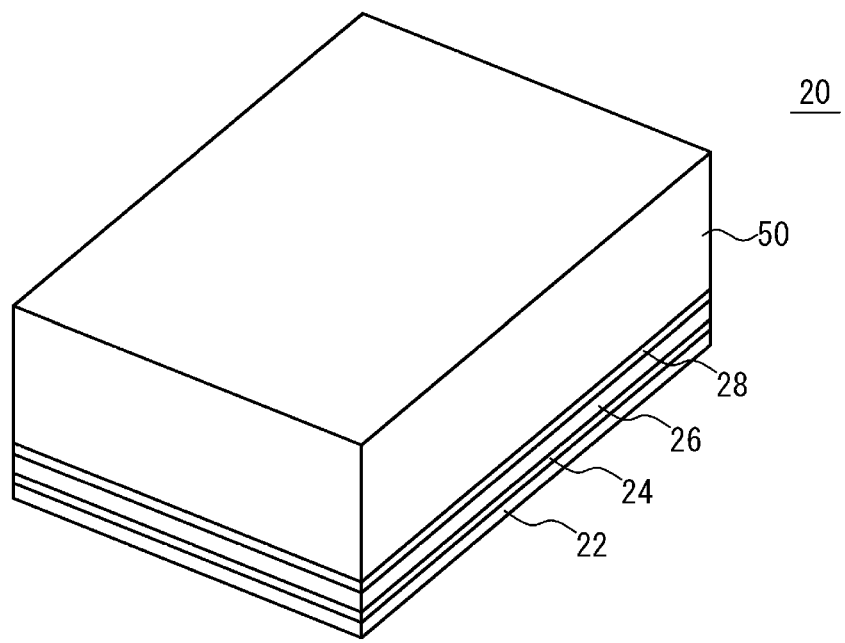
FIG. 4A is a perspective view illustrating a method of manufacturing the semiconductor optical device.
Figure 4B:
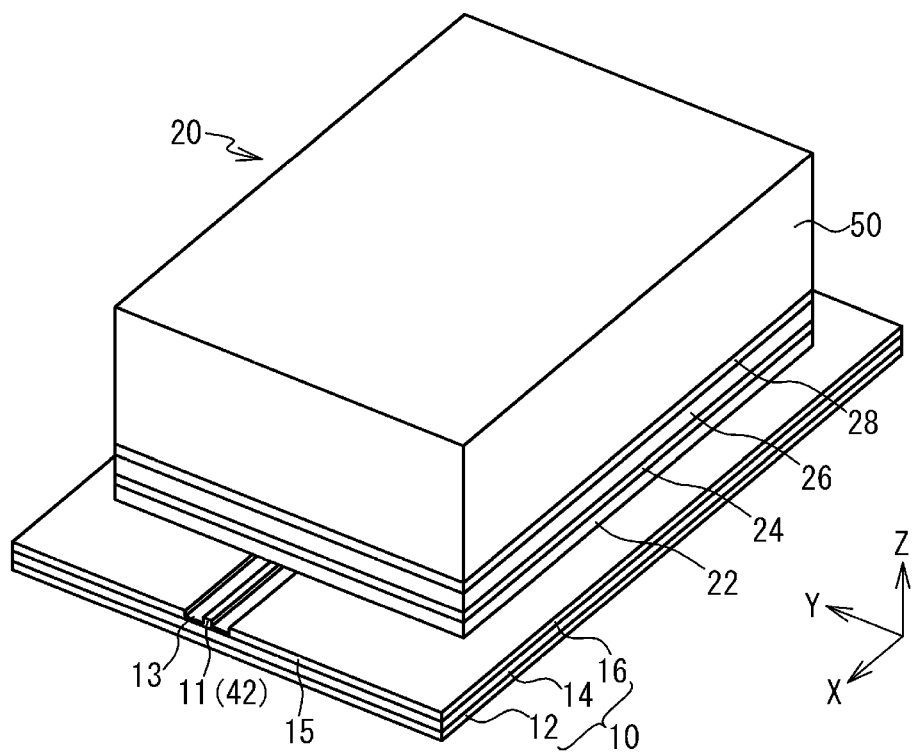
FIG. 4B is a perspective view illustrating the method of manufacturing the semiconductor optical device.
Figure 5A:
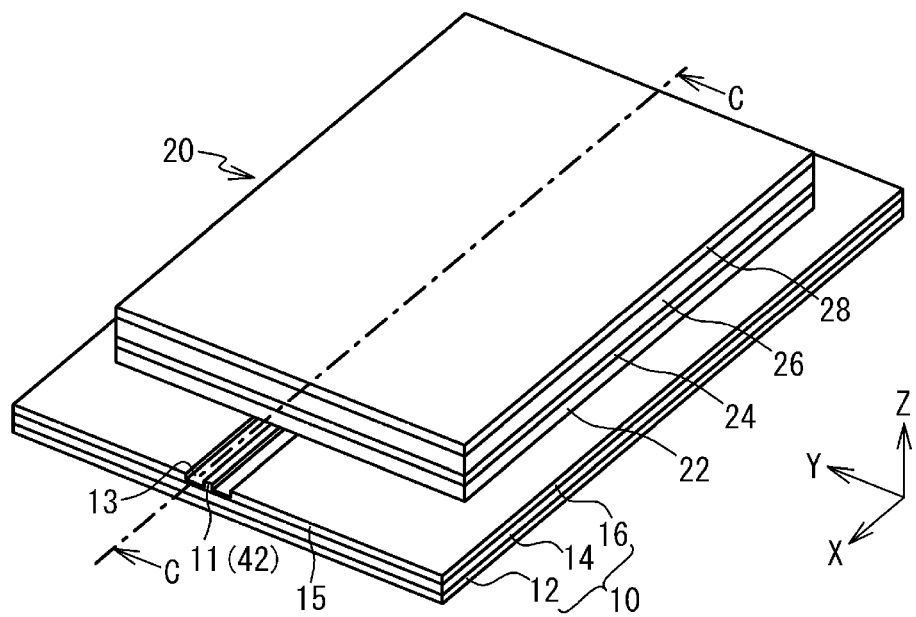
FIG. 5A is a perspective view illustrating the method of manufacturing the semiconductor optical device.
Figure 5B:
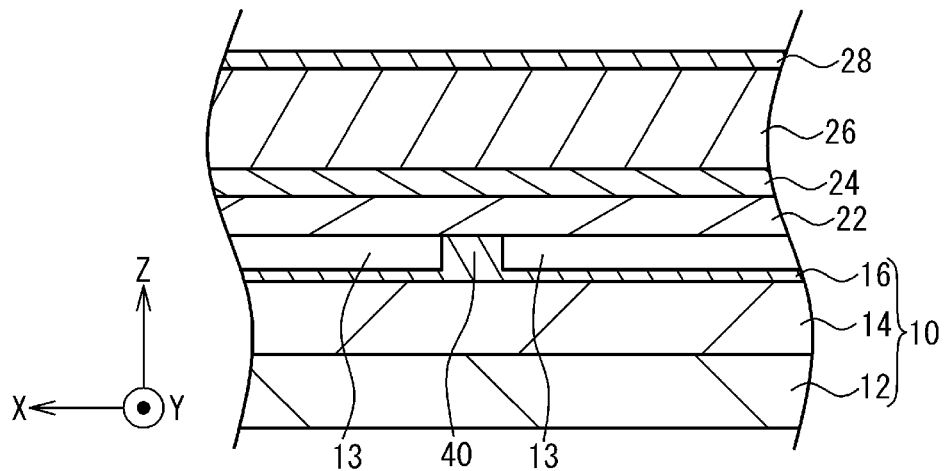
FIG. 5B is a sectional view along line C-C of FIG. 5A.

FIG. 4A to FIGS. 5A, 6A, 7A, and 7B are each a perspective view illustrating a method of manufacturing the semiconductor optical device 100. FIG. 5B is a sectional view along line C-C of FIG. 5A, FIG. 6B is a sectional view along line C-C of FIG. 6A, and both figures are enlarged views of the vicinity of the walls 40.

The Si layer 16 of the substrate 10 in a wafer state is dry-etched, and, as illustrated in FIG. 2A, the waveguide 11, the grooves 13, and the walls 40 are formed.

By, for example, organometallic vapor phase epitaxy (OMVPE), the contact layer 28, the cladding layer 26, the core layer 24, and the cladding layer 22 are epitaxially grown in order on a surface of a baseplate 50 made of a III-V compound semiconductor. By dicing the baseplate 50, a plurality of semiconductor elements 20, one of which is illustrated in FIG. 4A, are formed.

As illustrated in FIG. 4B, a surface of the semiconductor element 20 and a surface of the substrate 10 are subjected to, for example, plasma activation to bond the semiconductor element 20 to the substrate 10. Without using, for example, an adhesive for the bonding, the cladding layer 22 of the semiconductor element 20 is brought into contact with the upper surface of the waveguide 11, the upper surfaces of the terraces 15, and the upper surfaces of the walls 40 of the substrate 10. The semiconductor element 20 covers upper sides of the two wide-width portions 44 and upper sides of the four tapered portions 46 of the waveguide 11, and upper sides of the four walls 40. The baseplate 50 is positioned at a topmost portion of the semiconductor element 20.

As illustrated in FIG. 5A, for example, wet-etching is performed with hydrochloric acid or the like being an etchant to remove the baseplate 50 of the semiconductor element 20. After the wet-etching, the contact layer 28 is exposed. As illustrated in FIG. 5B, the cladding layer 22, the core layer 24, the cladding layer 26, and the contact layer 28 are not removed, and cover an upper side of the waveguide 11 and the upper sides of the walls 40. The semiconductor element 20 may be damaged due to side-etching that progresses during the wet-etching.

Figure 6A:
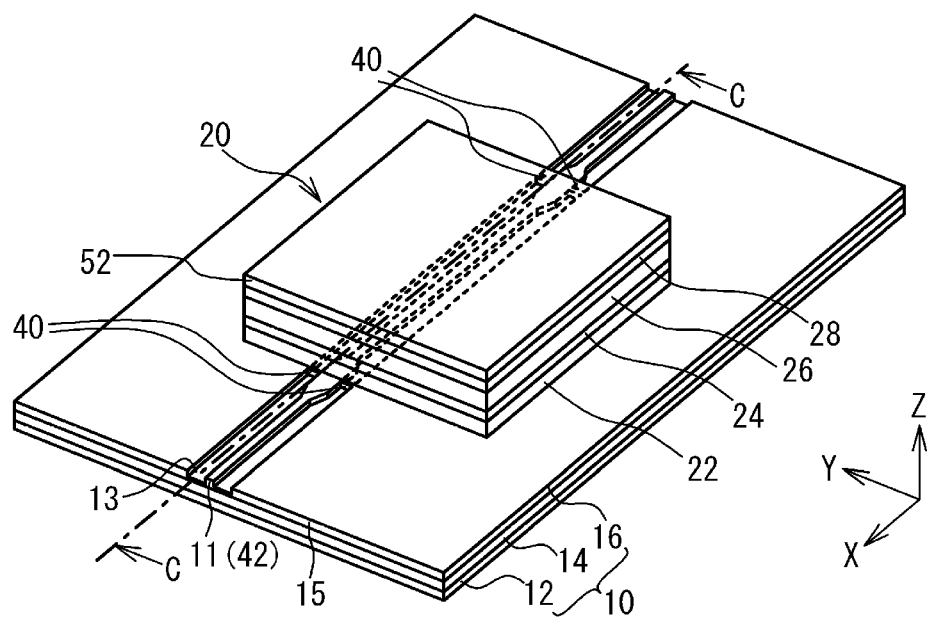
FIG. 6A is a perspective view illustrating the method of manufacturing the semiconductor optical device.
Figure 6B:
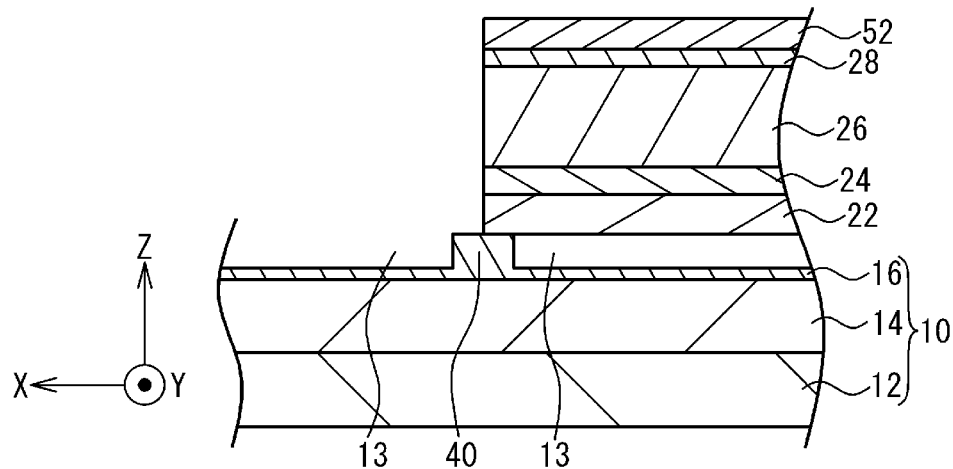
FIG. 6B is a sectional view along line C-C of FIG. 6A.

As illustrated in FIG. 6A and FIG. 6B, by, for example, photolithography, a $SiO_2$ mask 52 or the like is provided on the semiconductor element 20. End portions of the mask 52 are positioned on the walls 40. For example, by wet-etching with buffered hydrofluoric acid (BHF) or the like as an etchant, a portion of the semiconductor element 20 that is exposed from the mask 52 is removed to mold the semiconductor element 20 into, for example, a square shape.

After the wet-etching, a portion of the semiconductor element 20 that is protected by the mask 52 remains, and the end portions of the semiconductor element 20 in the X-axis direction are positioned on the walls 40. Although the etchant used in the wet-etching enters the grooves 13 of the substrate 10, the walls 40 cover the grooves 13 and serve as banks that hold back the etchant. The flow of the etchant into an inner side (right side in FIG. 6B) is suppressed by the walls 40, and etching of the semiconductor element 20 from a side of a bonding interface is also suppressed.

By the wet-etching in FIG. 6A and FIG. 6B, it is possible to remove portions damaged by the wet-etching of the baseplate 50. Positional displacement may occur when bonding the semiconductor element 20 to the substrate 10. By molding the semiconductor element into a certain shape as illustrated in FIG. 6A by the wet-etching, variations in position at the time of the bonding are eliminated. After the wet-etching, the semiconductor element 20 remains on a predetermined position within the substrate 10.

Figure 7A:
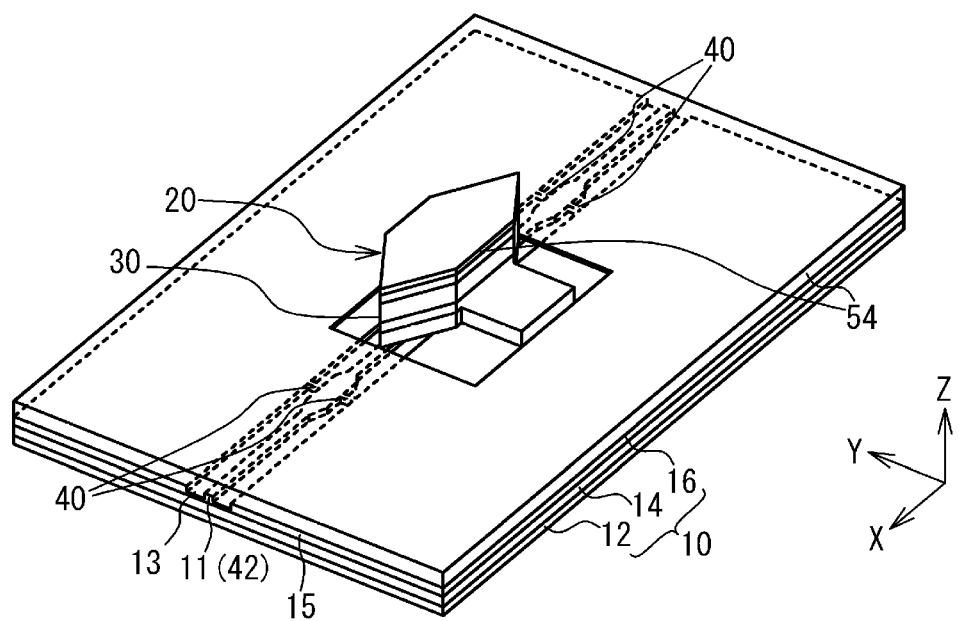
FIG. 7A is a perspective view illustrating the method of manufacturing the semiconductor optical device.
Figure 7B:
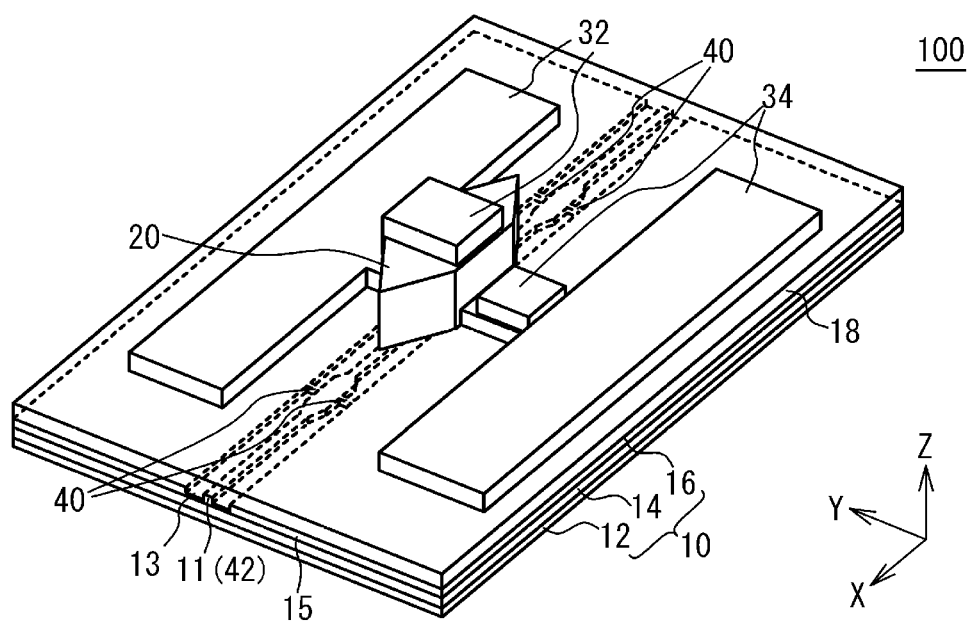
FIG. 7B is a perspective view illustrating the method of manufacturing the semiconductor optical device.

As illustrated in FIG. 7A, for example, a $SiO_2$ mask 54 is provided on the upper surface of the substrate 10 and a part of the semiconductor element 20. After providing the mask 54, dry-etching is performed to form the mesa 30 at the semiconductor element 20. The mesa 30 is positioned above the narrow-width portions 42 of the waveguide 11 and is separated from the wide-width portions 44 and the walls 40. After forming the mesa 30, a $SiO_2$ film is provided on the upper surface of the substrate 10 and a surface of the semiconductor element 20 that are exposed. The $SiO_2$ film forms, together with the mask 54, the electrically insulating film 18. As illustrated in FIG. 7B, the electrodes 32 and 34 are provided by, for example, vacuum deposition. The substrate 10 is diced along a dicing line surrounding one semiconductor element 20 to form the semiconductor optical device 100.

According to the first embodiment, the walls 40 of the substrate 10 cover the grooves 13. In the step of wet-etching the semiconductor element 20 illustrated from FIG. 5A to FIG. 6B, the etchant is held back by the walls 40 and is suppressed from entering inward from the walls 40. Etching from the bonding interface to portions that become gain regions in the semiconductor optical device 100, such as the mesa 30 of the semiconductor element 20, is suppressed. By suppressing damage to the semiconductor element 20, the semiconductor element 20 is unlikely to be peeled, and deterioration in characteristics is also suppressed.

Positional displacement may occur when bonding the semiconductor element 20 to the substrate 10. In the step of etching the baseplate 50, the semiconductor element 20 may be damaged. By the wet-etching illustrated in FIG. 6A and FIG. 6B, it is possible to remove portions of the semiconductor element 20 that have been damaged. As illustrated in FIG. 6A, by molding the semiconductor element 20 into a certain shape by the wet-etching, it is possible to suppress the effects of positional displacement on post-processes. As illustrated in FIG. 7A, it is possible to form the mesa 30 at the intended position within the substrate 10.

As illustrated in FIG. 6A and FIG. 6B, it is desirable that the end portions of the semiconductor element 20 after the wet-etching be positioned on the walls 40. When the end portions are positioned more inward (more rightward in FIG. 6B) than the walls 40 in the X-axis direction, the etchant enters by moving beyond the walls 40. When the end portions protrudes more leftward in FIG. 6B than the walls 40, the etchant remains below the semiconductor element 20 protruding beyond the walls 40. The etchant that has remained becomes a deposit and increases loss of light. By positioning the end portions of the semiconductor element 20 on the walls 40, it is possible to prevent entry of the etchant and to suppress the etchant from remaining.

As illustrated in FIG. 1A, the walls 40 are connected to the waveguide 11 and are separated from the mesa 30 in an extension direction of the waveguide 11. Light exiting from the mesa 30 propagates through the waveguide 11. In order to suppress a reduction in optical output, it is important to suppress the effects of the walls 40 on the light. As illustrated in FIG. 2B, the walls 40 are each connected to the corresponding wide-width portion 44 of the waveguide 11 whose width is larger than the width of the narrow-width portions 42. Compared with when the walls 40 are each connected to the corresponding narrow-width portion 42, it is possible to suppress the effects of the walls 40 and to suppress loss of the light.

As illustrated in FIG. 2B, it is desirable that each wall 40 be connected to the central region 44b of the corresponding wide-width portions 44. At the regions 44a of each wide-width portion 44, light spreads and is distributed in the Y-axis direction. On the other hand, at each central region 44b, light is focused, and is concentrated and distributed at the central side in the Y-axis direction. By connecting each wall 40 to the corresponding region 44b, the effects of the walls 40 are further suppressed, the light is unlikely to leak in a lateral direction, and loss of the light is suppressed. When each wide-width portion 44 is long in the X-axis direction, light is focused at each central region 44b, and leakage of the light can be effectively suppressed. It is desirable that the length L1 of each wide-width portion 44 be 50 μm or greater. As illustrated by the example indicated by the solid line in FIG. 3, even if each wall 40 is thick, it is possible to maintain high transmittance and to suppress loss of light. Although the shape of each wide-width portion 44 in the XY plane may not be a rectangular shape, it is desirable that the shape be a rectangular shape. Since, when the connection portions to the walls 40 are excluded, the equivalent refractive index of each wide-width portion 44 in the X-axis direction is substantially constant, loss of light is suppressed.

It is desirable that the thickness T1 of each wall 40 illustrated in FIG. 2B be 5 μm or greater. Even if the precision of photolithography is considered, as illustrated in FIG. 6B, the end portions of the mask 52 for the wet-etching can be formed above the walls 40. By forming the end portions of the mask 52 above the walls 40, the end portions of the semiconductor element 20 after the wet-etching can be formed on the walls 40. If the thickness T1 is 5 μm or greater, even if the semiconductor element 20 is side-etched in the wet-etching, the end portions are positioned on the walls 40. Since each wall 40 is connected to the corresponding wide-width portion 44, even if the walls 40 are made thick to a thickness of, for example, 5 μm or greater, it is possible to suppress the effects of the walls 40 on light. The thickness T1 of each wall 40 may be, for example, 8 μm or greater or 10 μm or greater. As illustrated in FIG. 3, when the length L1 of each wide-width portion 44 is about 54 μm, the transmittance can be 90%. In order to suppress the effects of the walls 40 on the propagation of light, it is desirable that the thickness T1 be, for example, 20 μm or less.

The waveguide 11, the terraces 15, and the walls 40 are formed at the Si layer 16 of the substrate 10. It is desirable that the height of each wall 40 be equal to the height of the waveguide 11 and the height of each terrace 15, and that their upper surfaces be positioned in the same plane. Due to the semiconductor element 20 and the walls 40 being in contact with each other, it is possible to more effectively suppress entry of an etchant. The height of each wall 40 may not be strictly the same as the height of the waveguide 11 and the height of each terrace 15, and may be, for example, slightly lower. An etchant is unlikely to enter a very small gap between the semiconductor element 20 and each wall 40. As illustrated in FIG. 2B, the $SiO_2$ layer 14 is provided on a lower side of the Si layer 16, the $SiO_2$ electrically insulating film 18 is provided on an upper side thereof, and two sides of the waveguide 11 are embedded with the electrically insulating film 18. Since the refractive index of the Si layer 16 is higher than the surrounding refractive indices, light is strongly confined in the waveguide 11 and loss can be suppressed.

The substrate 10 may be a SOI substrate, or a substrate other than a SOI substrate. It is desirable that the substrate 10 be a substrate including Si. Since the waveguide 11 of the substrate 10 has a refractive index higher than the refractive index of an electrically insulating material, such as $SiO_2$, and the refractive index of air, it is possible to strongly confine light.

It is desirable that the mask 54 made of an electrically insulating material cover the substrate 10 before forming the mesa 30. It is possible to suppress damage to the substrate 10 caused by dry-etching. Since the mask 54 is provided after molding the semiconductor element 20 as illustrate in FIG. 5A, a large part of the substrate 10 is protected by the mask 54 to make it possible to suppress damage to the waveguide 11.

Second Embodiment

Similarly to the example in FIG. 1A and FIG. 1B, a semiconductor optical device according to a second embodiment is also a hybrid laser device. A waveguide 11 of a substrate 10 of the second embodiment differs from the waveguide of the first embodiment. The structures other than the waveguide 11 are the same as those of the first embodiment.

Figure 8:
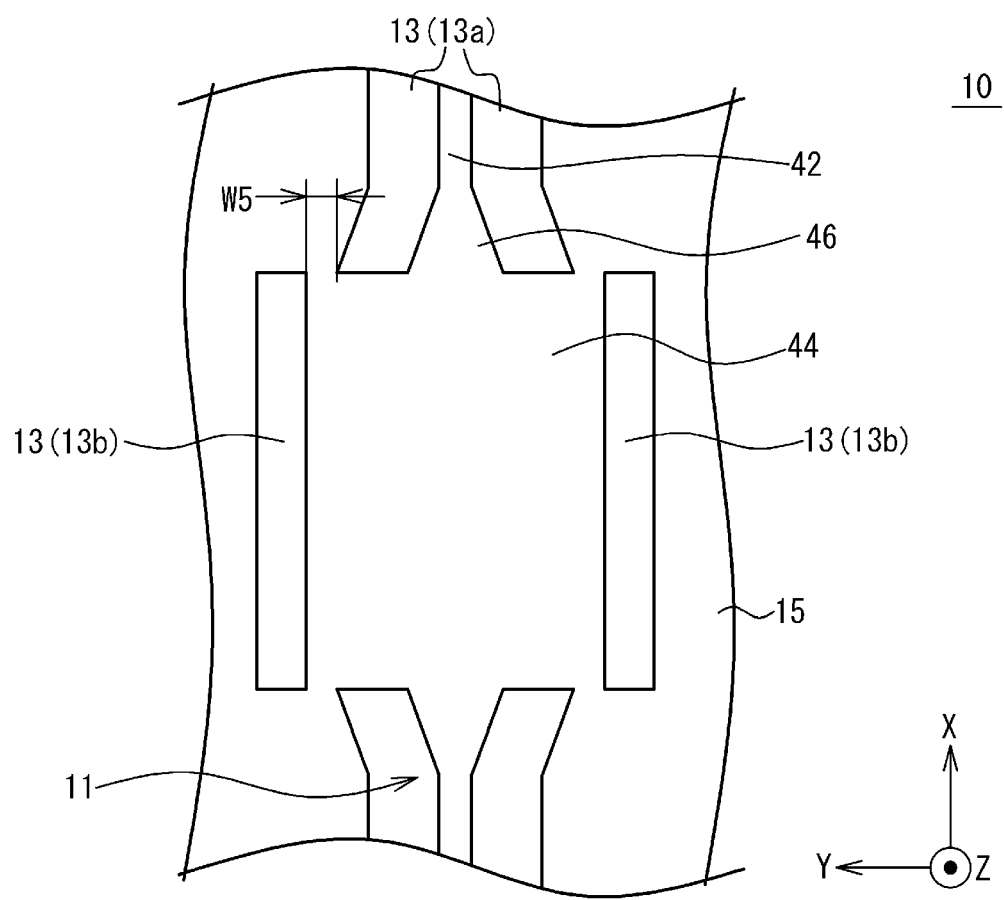
FIG. 8 is a plan view illustrating a substrate of a semiconductor optical device according to a second embodiment.

FIG. 8 is a plan view illustrating the substrate 10 of the semiconductor optical device according to the second embodiment and is an enlarged view of the vicinity of a wide-width portion 44 of the waveguide 11. In FIG. 8, the waveguide 11 includes two narrow-width portions 42, two tapered portion 46, and one wide-width portion 44. Grooves 13a of grooves 13 are each positioned on a corresponding one of two sides of the corresponding narrow-width portion 42 and on a corresponding one of two sides of the corresponding tapered portion 46. Grooves 13b of the grooves 13 are each positioned on a corresponding one of two sides of the wide-width portion 44.

The shape of the wide-width portion 44 in an XY plane is a rectangular shape, and its apex is connected to terraces 15. The wide-width portion 44 functions as a wall between the grooves 13a and the grooves 13b. A width W5 of each connection portion where the wide-width portion 44 and the corresponding terrace 15 are connected to each other is, for example, 0.5 µm. The length of the wide-width portion 44 in the X-axis direction is, for example, 27 µm.

Even in the second embodiment, a manufacturing method that is the same as the manufacturing method of the first embodiment is performed. The substrate 10 is dry-etched, and a waveguide, such as that illustrated in FIG. 8, is formed. After wet-etching illustrated in FIG. 6A and FIG. 6B, end portions of a semiconductor element 20 are positioned on, for example, the narrow-width portions 42, and the semiconductor element 20 after the wet-etching extends toward a side opposite to the wide-width portion 44 (upper side in FIG. 8). The semiconductor element 20 may extend toward a side of the wide-width portion 44 (lower side). The end portions of the semiconductor element 20 may be positioned on the wide-width portion 44. The end portions of the semiconductor element 20 may be parallel to the Y-axis direction, or may be tilted with respect to the Y-axis direction. The semiconductor element 20 molded by the wet-etching is dry-etched, and a mesa 30 is formed. The mesa 30 is positioned above the narrow-width portions 42 of the waveguide 11 and is separated from the wide-width portion 44.

According to the second embodiment, the wide-width portion 44 is a wall that covers a portion between the grooves 13a and the grooves 13b. An etchant is held back by the wide-width portion 44, and etching from a side of a bonding interface of the semiconductor element 20 is suppressed. It is possible to suppress damage to the semiconductor element 20 caused by the etching.

A wall that protrudes in the Y-axis direction may not be provided at the wide-width portion 44 of the waveguide 11. The equivalent refractive index of the wide-width portion 44 does not vary discontinuously in the X-axis direction, and is substantially the same. A reduction in transmittance is suppressed, and, for example, the transmittance with respect to basic-mode light having a wavelength of 1.55 µm is 98%. It is possible to suppress loss of light.

Third Embodiment

Similarly to the example in FIG. 1A and FIG. 1B, a semiconductor optical device according to a third embodiment is also a hybrid laser device. A waveguide 11 of a substrate 10 of the third embodiment differs from the waveguide of the first embodiment. The structures other than the waveguide 11 are the same as those of the first embodiment.

Figure 9:
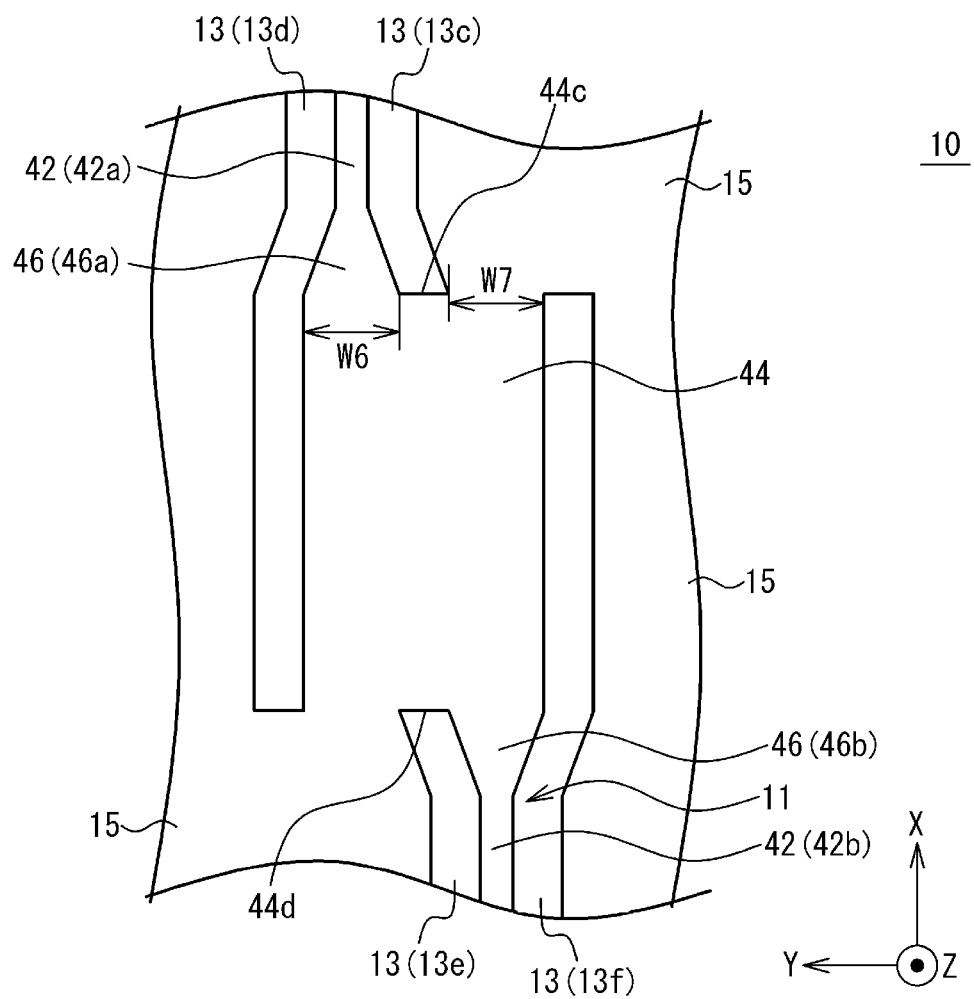
FIG. 9 is a plan view illustrating a substrate of a semiconductor optical device according to a third embodiment.

FIG. 9 is a plan view illustrating the substrate 10 of the semiconductor optical device according to the third embodiment, and is an enlarged view of the vicinity of a wide-width portion 44 of the waveguide 11. The waveguide 11 includes two narrow-width portions 42, two tapered portions 46, and one wide-width portion 44. One of the two narrow-width portions 42 in FIG. 9 is a narrow-width portion 42a, and the other of the two narrow-width portions 42 is a narrow-width portion 42b. One of the two tapered portions 46 is a tapered portion 46a, and the other of the two tapered portions 46 is a tapered portion 46b. One end of the wide-width portion 44 in the X-axis direction is an end portion 44c, and the other end of the wide-width portion 44 in the X-axis direction is an end portion 44d.

In the X-axis direction, the tapered portion 46a is connected to the end portion 44c of the wide-width portion 44, and the narrow-width portion 42a is connected to a tip of the tapered portion 46a. The tapered portion 46b is connected to the end portion 44d of the wide-width portion 44, and the narrow-width portion 42b is connected to a tip of the tapered portion 46b. In the Y-axis direction, the narrow-width portion 42a and the tapered portion 46a are connected to one side (left side in FIG. 9) of the wide-width portion 44. The narrow-width portion 42b and the tapered portion 46b are connected to the other side (right side in FIG. 9) of the wide-width portion 44. That is, the narrow-width portion 42a and the narrow-width portion 42b do not oppose each other in the X-axis direction.

A groove 13c and a groove 13d of grooves 13 are each positioned on a corresponding one of two sides of the narrow-width portion 42a and a corresponding one of two sides of the tapered portion 46a. The groove 13c extends to the end portion 44c of the wide-width portion 44. The groove 13d is longer than the groove 13c, and is adjacent to the end portion 44d of the wide-width portion 44 in the Y-axis direction. A groove 13e and a groove 13f of the grooves 13 are each positioned on a corresponding one of two sides of the narrow-width portion 42b and a corresponding one of two sides of the tapered portion 46b. The groove 13e extends to the end portion 44d of the wide-width portion 44. The groove 13f is longer than the groove 13e, and is adjacent to the end portion 44c of the wide-width portion 44 in the Y-axis direction. A width W6 of the tapered portion 46a on a base side and a width W7 between the groove 13c and the groove 13f are, for example, 1.5 μm. The length of the wide-width portion 44 is, for example, 109 μm.

Even in the third embodiment, a manufacturing method that is the same as the manufacturing method of the first embodiment is performed. The substrate 10 is dry-etched, and a waveguide, such as that illustrated in FIG. 9, is formed. After wet-etching illustrated in FIG. 6A and FIG. 6B, end portions of a semiconductor element 20 are positioned on, for example, the wide-width portion 44. The end portions of the semiconductor element 20 may be parallel to the Y-axis direction, or may be tilted with respect to the Y-axis direction.

According to the third embodiment, the wide-width portion 44 functions as a wall that covers a portion between the groove 13c and the groove 13d and the groove 13e and the groove 13f. An etchant is held back by the wide-width portion 44, and damage to the semiconductor element 20 is suppressed. The grooves 13c and 13d and the groove 13f are disposed side by side in the Y-axis direction. The groove 13e and the groove 13d are disposed side by side in the Y-axis direction, and the wide-width portion 44 is interposed therebetween. Although the groove 13c and the groove 13e oppose each other in the X-axis direction, the wide-width portion 44 is also positioned therebetween. It is possible to effectively suppress entry of an etchant by the wide-width portion 44.

A wall that protrudes in the Y-axis direction may not be provided at the wide-width portion 44 of the waveguide 11. The equivalent refractive index of the wide-width portion 44 is the same in the X-axis direction. A reduction in transmittance is suppressed, and, for example, the transmittance with respect to basic-mode light having a wavelength of 1.55 μm is 97%. It is possible to suppress loss of light.

Although the embodiments of the present disclosure have been described in detail above, the present disclosure is not limited to specific embodiments, and various modifications/changes are possible within the scope of the spirit of the present disclosure as described in the claims.

What is claimed is:

1. A method of manufacturing a semiconductor optical device, comprising:
   a step of bonding a semiconductor element to a substrate that includes silicon, the semiconductor element being made of a III-V compound semiconductor and having optical gain;
   after the step of bonding the semiconductor element, a step of molding the semiconductor element by wet-etching; and
   after the step of molding the semiconductor element, a step of forming a mesa at the semiconductor element, wherein the substrate includes a waveguide, a groove that extends along the waveguide, a terrace that is positioned on a side of the groove opposite to the waveguide, and a wall that covers the groove and the wall has a wall upper surface,
   wherein the waveguide includes a first portion and a second portion, the first portion has a first portion upper surface and the second portion has a second portion upper surface,
   wherein the wall upper surface, the first portion upper surface, and the second portion upper surface are each positioned at a same height from a bottom surface of the groove, and
   wherein the step of bonding the semiconductor element is a step of bonding the semiconductor element to the waveguide, the groove, the terrace, and the wall of the substrate.

2. The method of manufacturing a semiconductor optical device according to claim 1, wherein, in the step of molding the semiconductor element, the semiconductor element is molded so that an end portion of the semiconductor element is positioned on the wall.

3. The method of manufacturing a semiconductor optical device according to claim 1,
   wherein the first portion and the second portion are disposed side by side in an extension direction of the waveguide and are connected to each other,
   wherein the second portion has a width that is larger than a width of the first portion in a direction intersecting the extension direction of the waveguide, and
   wherein the wall is connected to the second portion and the terrace.

4. The method of manufacturing a semiconductor optical device according to claim 3, wherein the wall is connected to a central portion of the second portion in the extension direction of the waveguide.

5. The method of manufacturing a semiconductor optical device according to claim 3, wherein a length of the second portion in the extension direction of the waveguide is 50 μm or greater.

6. The method of manufacturing a semiconductor optical device according to claim 1, wherein a thickness of the wall is 5 μm or greater.

7. The method of manufacturing a semiconductor optical device according to claim 1,
   wherein the first portion and the second portion are disposed side by side in an extension direction of the waveguide and are connected to each other,
   wherein the second portion has a width that is larger than a width of the first portion in a direction intersecting the extension direction of the waveguide, and
   wherein the second portion is connected to the terrace and functions as the wall.

8. The method of manufacturing a semiconductor optical device according to claim 1, wherein the semiconductor element includes a compound semiconductor baseplate and a compound semiconductor layer that is stacked on the compound semiconductor baseplate,
   wherein, in the step of bonding the semiconductor element, the compound semiconductor layer and the substrate are bonded to each other,
   wherein the method comprises, after the step of bonding the semiconductor element, a step of removing the compound semiconductor baseplate of the semiconductor element by wet-etching, and
   wherein, after the step of removing the compound semiconductor baseplate, the step of molding the semiconductor element is performed.

9. The method of manufacturing a semiconductor optical device according to claim 1, wherein the substrate includes a silicon layer, and wherein the waveguide, the terrace, and the wall are formed at the silicon layer.

10. The method of manufacturing a semiconductor optical device according to claim 1, further comprising:
after the step of molding the semiconductor element, a step of covering the substrate with an electrically insulating film,
wherein the step of forming the mesa at the semiconductor element includes, after the step of covering the substrate with the electrically insulating film, a step of dry-etching the semiconductor element.

11. A semiconductor optical device comprising:
a substrate that includes silicon, and that includes a waveguide, a groove that extends along the waveguide, and a terrace that opposes the waveguide with the groove therebetween; and
a semiconductor element that is bonded to the waveguide and the terrace, that is made of a III-V compound semiconductor, and that has optical gain,
wherein the waveguide includes a first portion and a second portion, the first portion has a first portion upper surface and the second portion has a second portion upper surface,
wherein the first portion and the second portion are disposed side by side in an extension direction of the waveguide and are connected to each other,
wherein the second portion has a width that is larger than a width of the first portion in a direction intersecting the extension direction of the waveguide,
wherein the substrate includes a wall that is connected to the second portion and the terrace and that covers the groove, or the second portion covers the groove, and the wall has a wall upper surface, and
wherein the wall upper surface, the first portion upper surface, and the second portion upper surface are each positioned at a same height from a bottom surface of the groove.

* * * * *